United States Patent [19]

Ahne

[11] Patent Number: 4,610,947
[45] Date of Patent: Sep. 9, 1986

[54] METHOD AND MANUFACTURING POLYIMIDAZOLE AND POLYIMIDAZOPYRROLONE RELIEF STRUCTURES

[75] Inventor: Hellmut Ahne, Röttenbach, Fed. Rep. of Germany

[73] Assignee: Siemens Aktiengesellschaft, Munich, Fed. Rep. of Germany

[21] Appl. No.: 716,447

[22] Filed: Mar. 27, 1985

[30] Foreign Application Priority Data

Mar. 29, 1984 [DE] Fed. Rep. of Germany ....... 3411714

[51] Int. Cl.$^4$ .................. G03C 1/70; G03C 5/16
[52] U.S. Cl. .................... 430/296; 430/283; 430/287; 430/325; 430/330; 430/311; 430/945
[58] Field of Search .............. 430/283, 287, 325, 330, 430/311, 296, 945

[56] References Cited

U.S. PATENT DOCUMENTS

| | | | |
|---|---|---|---|
| 4,332,882 | 6/1982 | Ahne et al. | 430/280 |
| 4,410,612 | 10/1983 | Goff et al. | 430/283 X |
| 4,540,650 | 9/1985 | Klug et al. | 430/283 X |
| 4,547,455 | 10/1985 | Hiramoto et al. | 430/283 X |
| 4,558,117 | 12/1985 | Nakano et al. | 430/283 X |

FOREIGN PATENT DOCUMENTS 0131992 1/1985 European Pat. Off. ............ 430/283

OTHER PUBLICATIONS

Jerry March, *Advanced Organic Chemistry: Reactions, Mechanisms and Structure,* second ed., McGraw-Hill Book Company, New York, New York, 1977, pp. 363–365, 369–370, 384–385.

*Primary Examiner*—John E. Kittle
*Assistant Examiner*—Cynthia Hamilton
*Attorney, Agent, or Firm*—Kenyon & Kenyon

[57] ABSTRACT

Highly heat-resistant polyimidazole and polyimidazopyrrolone relief structures can be manufactured in a very pure form and with short exposure times by applying radiation-sensitive soluble polymer precursors in the form of a layer or a foil to a substrate, irradiating the layer or foil through negative patterns with actinic light, or electrons, or by guiding a light, electron, ion, or laser beam, removing the non-irradiated layer or foil parts, and optionally subsequently annealing. Thereby reaction products, which are prepared in the presence of carbodiimides, of aromatic and/or heterocyclic tetraamino compounds and either: (a) olefinically unsaturated monocarboxylic acids and dicarboxylic acids, or (b) olefinically unsaturated monocarboxylic acids and aromatic and/or heterocyclic tetracarboxylic acid dianhydrides, or (c) olefinically unsaturated tetracarboxylic acid diesters in the form of addition products of the tetracarboxylic acid dianhydrides and olefinically unsaturated alcohols are used as polymer precursors. The relief structures prepared according to the invention are particularly well suited for use as a resist, surface protection, and because of their high purity, as a durable protective and insulating material in the semiconductor area.

9 Claims, No Drawings

METHOD AND MANUFACTURING POLYIMIDAZOLE AND POLYIMIDAZOPYRROLONE RELIEF STRUCTURES

BACKGROUND OF THE INVENTION

The invention relates to a method for manufacturing highly heat-resistant polyimidazole and polyimidazopyrrolone relief structures by applying radiation-sensitive soluble polymer precursors to a substrate in the form of a layer or foil, irradiating the layer or foil through negative patterns with actinic light or electrons, or by guiding a light, electron, ion, or laser beam, removing the non-irradiated layer or foil portions, and optionally subsequently annealing the remaining portions; as well as to the use of these relief structures.

From U.S. Pat. No. 4,332,882, a method of the type mentioned above for manufacturing highly heat-resistant polyimidazole and polyimidazopyrrolone relief structures is known. In this method, addition products of olefinically unsaturated monoepoxides and eitner: (a) amino group—containing polycondensation products prepared from reacting aromatic and/or heterocyclic tetramino compounds with dicarboxylic acid chlorides or esters, or (b) amino group-containing poly-addition products of the tetraamino compounds and tetracarboxylic acid dianhydrides are used as polymer precursors.

The relief structures prepared by the known method are characterized by special properties. Thus, they withstand heating processes up to 450° C. and are also resistant to heavy radiation in extended operation. The known relief structures are also suitable as masks for the fine structuring of substrates by wet chemistry, for instance, by alkaline or acid etching. In the known method the processing properties of the polymer precursors are not yet quite satisfactory; in particular, their photosensitivy is limited.

SUMMARY OF THE INVENTION

It is an object of the invention to improve the method of the type mentioned above for the preparation of polyimidazole and polyimidazopyrrolone relief structures so that highly heat-resistant and very pure relief structures can be prepared with short exposure times.

According to the invention, this is achieved by employing as polymer precursors reaction products, prepared in the presence of carbodiimides, of aromatic and/or heterocyclic tetraamino compounds and either: (a) olefinically unsaturated monocarboxylic acids and dicarboxylic acids, or (b) olefinically unsaturated monocarboxylic acids and aromatic and/or heterocyclic tetracarboxylic acid dianhydrides, or (c) olefinically unsaturated tetracarboxylic acid diesters in the form of addition products of the tetracarboxylic acid dianhydrides and olefinically unsaturated alcohols.

The relief structures manufactured in accordance with the method of the invention exhibit excellent temperature stability. In addition, these relief structures are in part soluble in polar organic solvents such as dimethyl sulfoxide, dimethyl acetamide, dimethyl formamide and N-methylpyrrolidone, and can therefore also be removed again from substrates, if required.

The method according to the invention is further characterized by the feature that the polymer precursors used are in part soluble in aqueous-alkaline media, i.e., the radiation-sensitive precursors can be developed, after exposure, in an aqueous-alkaline process. This is of interest particularly for economic and ecological reasons since the disadvantages of organic developers, such as flammability and toxicity, are eliminated. The method according to the invention is, in addition, distinguished by the feature that extremely sharp-edged structures with very good resolution are obtained with relatively short exposure time.

According to the method of the invention, the polymer precursors can be used advantageously, together with light or radiation-sensitive copolymerizable compounds. For this purpose, N-substituted maleimides are preferably used. However, acrylate or methacrylate group-containing compounds can also be used. Furthermore, photoinitiators and/or photosensitizers can also be used. (see "Industrie Chimique Belge", 24, 1959, pages 739 to 764, as well as J. Kosar, "Light-Sensitive Systems", John Wiley & Sons, Inc., New York 1965, pages 143 to 146 and pages 160 to 188). Especially well-suited are imidazoles, particularly benzimidazoles and ketocoumarins, as well as Michler's ketone; other suitable compounds are for instance benzoin ether, 2-tert-.butyl-9,10-anthraquinone; 1,2-benz-9,10-anthraquinone, and 4,4'-bis-(diethylamino)-benzophenone. Furthermore, adhesion agents can be used to advantage in the method according to the invention. This purpose is served particularly by silanes such as vinyltriethoxy silane, vinyl-tris($\beta$-methoxyethoxy)silane, $\gamma$-methacryloxy-propyl-trimethoxy silane and $\gamma$-glycidoxypropyl-trimethoxy silane.

DETAILED DESCRIPTION OF THE INVENTION

The radiation-sensitive precursors which are used in the method according to the invention, and are of an oligomeric and/or polymeric nature are described in the simultaneously filed U.S. patent application "Method for the Manufacture of Polyimidazole and Polyimidazo-Pyrrolone Precursors" (Siemens, VPA 84 P 3118 US). These precursors generally have the following structure:

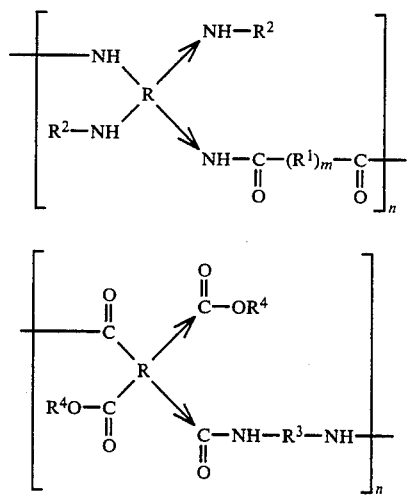

The arrows contained in the formulas (the first formula stands here for polyimidazole precursors and the second formula for polyimidazopyrrolone precursors) signify that the two substituents at R can interchange their positions. This is important, because R is a cyclic radical, as explained in the following:

In the formulas, n means an integral number from 2 to about 100 and m is 0 or 1. The following applies to R, $R^1$, $R^2$, $R^3$, and $R^4$:

R is an optionally halogenated, at least partially aromatic and/or heterocyclic tetravalent, i.e. tetrafunctional radical in which two respective valences are arranged in mutually adjacent positions; if the radical R has several aromatic and/or heterocyclic structural elements, then the valence pairs are respectively located in such structural elements in end positions;

$R^1$ is an optionally halogenated divalent, i.e. difunctional radical with an aliphatic and/or cycloaliphatic structure, optionally containing hetero atoms, and/or an aromatic and/or heterocyclic structure;

$R^2$ is an olefinically unsaturated radical, for instance, an alkyl ether-containing group, especially an optionally substituted (meth)acrylic ester-containing group or a propargyl group;

$R^3$ is an at lecast partially aromatic and/or heterocyclic divalent, i.e. difunctional radical, in which an amino group is arranged in adjacent position at least to one of the two valences; if $R^3$ comprises several aromatic and/or heterocyclic structural elements, the free valences are respectively located at such structural elements in end positions.

$R^4$ is hydrogen or $R^2$.

As explained, the relief structures according to the invention are made by applying the polymer precursor to a substrate in the form of a layer or foil, exposing the foil or layer with actinic light or electrons through a mask, or irradiating it with a light, electron, ion, or laser beam; subsequently the nonexposed portions of the layer or foil are dissolved or pulled off. The relief structures obtained thereby can be optionally annealed. The precursor can advantageously be dissolved in an organic solvent and applied to the substrate; preferably, N-methyl pyrrolidone is used. The concentration of the solution can be adjusted so that a layer thickness from 0.01 to several μm can be generated by known coating methods such as centrifuging, immersing, spraying, brushing, or rolling. It has been found that, for instance, in centrifugal coating 300 to 10,000 revolutions per minute for 1 to 100 sec are suitable to obtain a uniform and high surface quality. From the photoresist layer applied to the substrate, which preferably consists of glass, metal, plastic, or semiconductor material, the solvent can be removed at room temperature or at an elevated temperature, preferably 20–50° C, in a nitrogen or air stream. Advantageously, one can also work in a vacuum.

Exposure times between 10 and 600 sec are sufficient to obtain a satisfactory solubility difference between the irradiated and non-irradiated layer or foil parts, if a 500 W mercury extra-high pressure lamp is used. The actual exposure time will depend on the composition and layer thickness. After exposure, the non-exposed parts of the layer or foil are removed, preferably by aqueous-alkaline means, and also by an organic developer.

By means of the method according to the invention, images with sharp contours, i.e. relief structures, are obtained. These structures are converted by annealing into highly heat-resistant polymers, which are also resistant to acids and bases. In general, temperatures of 220° to 500° C. can be chosen, and the annealing preferably takes place at temperatures of 300° to 400° C. The annealing generally requires ½ hour, and no discoloration is observed in nitrogen. The contour sharpness and the dimensional accuracy of the relief structures are practically not effected by the annealing. In addition, the high surface quality of the relief structures is retained in spite of the loss of layer thickness that occurs during the annealing process.

In the method according to the invention, polymer precursors of aromatic components are preferably used, so that in the thermal treatment, i.e., in the annealing, polymers with the following structural units are formed:

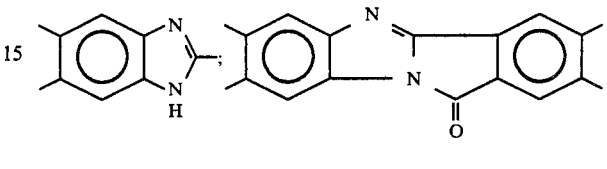

Polyimidazole    Polyimidazopyrrolone

The mentioned classes of compounds are among the semiladder or ladder polymers and are distinguished by their high temperature stability (up to about 500° C.).

Otherwise, polyimidazole precursors are prepared in such a manner that a tetraamino compound is either reacted first with an olefinically unsaturated monocarboxylic acid and the condensation product formed thereby is then polycondensed with a dicarboxylic acid or that the tetraamino compound is first reacted with the dicarboxylic acid and the polycondensation product formed thereby is then condensed with the olefinically unsaturated monocarboxylic acid. Each of these reactions is carried out in the presence of carbodiimide.

For the preparation of polyimidazopyrrolone precursors, a tetraamino compound is either reacted first in the presence of carbodiimide with an olefinically unsaturated monocarboxylic acid, and the condensation product formed in the process is then polyadded to a tetracarboxylic acid dianhydride, or the tetraamino compound is first reacted with the tetracarboxylic acid dianhydride and the polyaddition product formed thereby is then condensed, in the presence of carbodiimide, with the olefinically unsaturated *) A further possibility for the preparation of polyimidazopyrrolone precursors consists in reacting the tetraamino *) monocarboxylic acid. compound with an olefinically unsaturated tetracarboxylic acid diester in the presence of carbodiimide.

The radiation-sensitive precursors used in the method according to the invention are substantially polycondensation products of tetraamino compounds with dicarboxylic acids (polyimidazole precursors), or polyaddition products of the tetraamino compounds and tetracarboxylic acid dianhydrides and polycondensation *) and tetracarboxylic acid diesters (polyimidazopyroolone precursors). As the tetraamino compound, diaminobenzidine is preferred. The preferably used dicarboxylic acid is isophthalic acid and the preferred tetracarboxylic acid dianhydride is pyrometallitic acid dianhydride. In the preparation of the precursors, unsaturated monocarboxylic acids are used, acrylic acid and methacrylic acid being preferred. Among the likewise used unsaturated alcohols, hydroxyethyl-acrylate and hydroxyethylmethacrylate are preferably used. Of the carbodiimides required for the preparation of the precursors, dicyclohexyl-carbodiimide is preferred; carbodiimides are compounds of the type R'-N=C=N-R".

The relief structures according to the invention can be used for the preparation of passivating layers on semiconductor components, of thin and thick film circuits, of solder protection layers on multilayer circuits, of insulating layers as part of multilayer circuits and of miniaturized protection and insulating layers on electrically conducting and/or semiconducting and/or insulating base materials, particularly in the field of microelectronics or generally for the fine structuring of substrates. Preferably the high temperature-resistant relief structures serve as masks for wet and dry etching processes, currentless or *) products of the tetraamino compounds electroplated metal deposition, and vapor deposition, as well as masks for ion implantation and, in addition, as insulating and protection layers in electrical technology. Relief structures with a base of polyimidazoles can be used to advantage in those cases where the relief structure is to execute an intermediary protection function; because these relief structures are soluble in polar solvents and can therefore be readily removed again. In addition, the relief structures according to the invention can be used as orientation layers, for instance, in liquid-crystal displays, as well as for rastering surfaces such as in X-ray screens and particular X-ray image amplifiers.

This invention will now be explained in greater detail with the aid of the embodiment examples.

EXAMPLE 1

Preparation of a Radiation-sensitive Polybenzimidazole Precursor 21.4 parts by weight diaminobenzidine (0.1 mole) and 16 parts by weight methacrylic acid (0.19 mole) are dissolved in 70 parts by volume N-methylpyrrolidone. While stirring and cooling down to 10° C., 42 parts by weight dicyclohexylcarbodiimide (0.2 mole) are added drop-wise to the solution in 100 parts by volume β-butyrolactone. After the addition is completed, the reaction solution is allowed to stand for 3 hours at room temperature. Then 16.6 parts by weight isophthalic acid (0.1 mole) are added to the reaction solution and subsequently a solution of 42 parts by weight dicyclohexyl-carbodiimide (0.2 mole) in 120 parts by volume γ-butyrolactone is slowly added drop-wise while stirring and cooling down to 8° C. In this process, a viscous resin solution forms which is allowed to stand at room temperature for 18 hours. Subsequently, the dicyclohexyl urea is filtered off and a clear resin solution is obtained.

Preparation of a Relief Structure

To 20 ml of the resin solution obtained, 0.1 g Michler's ketone and 0.3 g N-phenylmaleimide are added. By means of a centrifuge, a homogeneous layer is produced therefrom on an aluminum sheet and is subsequently dried at a temperature of 30° C. and a pressure of $0.5 \times 10^4$ Pa. With an exposure time of 60 sec through a mask (by means of a 500 W mercury extra-high pressure lamp) and spray development with γ-butyrolactone for a period of 20 sec, relief structures are obtained which can be converted into polybenzimidazole relief structures by annealing at a temperature of 400° C. (duration: 30 min.) With a layer thickness of 3 μm, structures of 5 μm are still resolved properly.

EXAMPLE 2

Preparation of a Radiation-sensitive Polyimidazo-Pyrrolone Precursor

To 21.8 parts by weight pyromellitic acid dianhydride (0.1 mole) in 50 parts by volume N-methyl pyrrolidone 26 parts by weight hydroxyethylmethacrylate (0.2 mole) are added while stirring and in the absence of moisture. The reaction mixture is then allowed to stand at room temperature for 20 hours. The carboxyl content determined by titration is 0.21 mole/100 g. While stirring, a solution of 20.4 parts by weight diaminobenzidine (0.09 mole) in 70 parts by volume N-methylpyrrolidone is added to the reaction solution. Subsequently, a solution of 42 parts by weight dicyclohexylcarbodiimide (0.2 mole) in 120 parts by volume γ-butyrolactone is drop-wise added to the solution, cooled down to a temperature of 5° to 10° C. After the addition is completed, the viscous reaction solution is allowed to stand at room temperature for 20 hours and is freed thereafter of the precipitated dicyclohexyl urea by filtration. During the drop-wise addition of the resin solution in distilled water while stirring, a yellow solid substance is precipitated which yields a yellow resin powder after drying at a temperature of 40° C. and a pressure of $1.3 \times 10^4$ Pa. In the IR Spectrum, the absorptions at 950 and 1630 cm$^{-1}$ typical of methacrylates are present.

Preparation of the Relief Structure 10 parts by weight of the polyimidazopyrrolone precursor isolated as a solid resin in the manner described above are dissolved, together with 0.2 parts by weight Michler's ketone, and 0.2 parts by weight azidosulfonylphenyl maleimide in 17 parts by volume N-methylpyrrolidone, and then reacted with 0.1 parts by weight vinyl-tris(β-methoxyethoxy)silane. After pressure filtration through a 0.8 μm filter, layers 2 μm thick are generated on a silicon wafer by centrifuging. Upon irradiation through a contact mask with a 350 W mercury extra-high pressure lamp and development with N-methylpyrrolidone for 20 sec, fine relief structures are obtained which can be converted by heating to a temperature of 420° C. (duration: 30 min) into highly heat-resistant polyimidazopyrrolone relief structures.

What is claimed is:

1. A method for manufacturing a highly heat-resistant polyimidazole or polyimidazopyrrolone relief structure comprising the steps of: applying a radiation-sensitive soluble polymer precursor as a layer or foil to a substrate; irradiating the applied layer or foil through negative patterns using actinic light or electrons or by guiding a light, electron, ion, or laser beam; removing the unirradiated applied layer or foil parts and annealing the remaining irradiated applied layer or foil parts to produce the polyimidazole or polyimidazopyrrolone relief structure; wherein the polymer precursor is a reaction product, prepared by condensation or addition, as appropriate of:
   (a) an aromatic and/or heterocyclic tetraamino compound and one acid selected from group A consisting of an olefinically unsaturated monocarboxylic acid and a dicarboxylic acid in the presence of a carbodiimide to produce an intermediate A followed by condensation of intermediate A and the other acid of group A not already selected, in the presence of a carbodiimide to produce the polymer precursor; or (b) an aromatic and/or heterocyclic tetraamino compound and one member selected from group B consisting of an olefinically unsaturated monocarboxylic acid and an aromatic and/or heterocyclic tetracarboxylic acid dianhydride, in the presence of a carbodiimide if the monocarboxylic acid is selected, to produce an intermediate B followed by condensation or addition, as appropriate, of intermediate B and the other member of group B not already selected, in the presence of a carbodiimide if the monocarboxylic acid is selected, to produce the polymer precursor; or (c) an aromatic and/or heterocyclic tetraamino compound and an olefinically unsaturated tetracarboxylic acid diester which is an addition product of a tetracarboxylic acid dianhydride and an olefinically unsaturated alcohol, in the presence of a carbodiimide to produce the polymer precursor.

2. A method according to claim 1, wherein the polymer precursor is combined with a light-or radiation-sensitive compound which is capable of copolymerization.

3. A method according to claim 2, wherein the light- or radiation-sensitive compound is N-substituted maleimide.

4. A method according to claim 1, wherein the polymer precursor is combined with a photo-initiator and/or photo-sensitizer.

5. A method according to claim 4, wherein the photo-initiator and/or photosensitizer is Michler's ketone, a benzimidazole, and/or a ketocoumarin.

6. A method according to claim 1, wherein an adhesion agent is used, preferably a silane.

7. A method according to claim 1, wherein the polymer precursor is a polycondensation product of isophthalic acid and a condensation product, prepared in the presence of a carbodiimide, of acrylic acid or methacrylic acid, and diaminobenzidine.

8. A method according to claim 1, wherein the polymer precursor is a polycondensation product of diamino benzidine and an addition product of hydroxyethylacrylate or hydroxyethylmethacrylate and pyromellitic acid anhydride.

9. A method according to claim 6 wherein the adhesion agent is a silane.

* * * * *